United States Patent
Changchien et al.

(10) Patent No.: US 9,754,796 B2
(45) Date of Patent: *Sep. 5, 2017

(54) HARD MASK REMOVAL SCHEME

(71) Applicant: TAIWAN SEMICONDUCTOR MANUFACTURING CO., LTD., Hsinchu (TW)

(72) Inventors: Ying-Hsueh Changchien, Hsinchu (TW); Yu-Ming Lee, New Taipei (TW); Chi-Ming Yang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/018,713

(22) Filed: Feb. 8, 2016

(65) Prior Publication Data
US 2016/0155646 A1 Jun. 2, 2016

Related U.S. Application Data

(62) Division of application No. 14/202,876, filed on Mar. 10, 2014, now Pat. No. 9,287,133.

(51) Int. Cl.
| H01L 21/311 | (2006.01) |
| H01L 21/67 | (2006.01) |
| H01L 21/033 | (2006.01) |
| H01L 21/3213 | (2006.01) |

(52) U.S. Cl.
CPC .... *H01L 21/31111* (2013.01); *H01L 21/0332* (2013.01); *H01L 21/31144* (2013.01); *H01L 21/32134* (2013.01); *H01L 21/6708* (2013.01)

(58) Field of Classification Search
None
See application file for complete search history.

(56) References Cited

U.S. PATENT DOCUMENTS

| 9,287,133 B2 * | 3/2016 | Changchien | H01L 21/31111 |
| 2010/0108096 A1 * | 5/2010 | Minami | H01L 21/6708 |
| | | | 134/10 |
| 2011/0130007 A1 | 6/2011 | Ching et al. | |
| 2012/0052678 A1 | 3/2012 | Sapra et al. | |
| 2014/0199832 A1 | 7/2014 | Nguyen et al. | |

OTHER PUBLICATIONS

Fu-Hsing Lu et al.; XPS analyses of TiN films on Cu substrates after annealing in the controlled atmosphere; Elsevier Science S.A., Thin Solid Films 355-356 (1999) 374-379.

(Continued)

*Primary Examiner* — Asok K Sarkar
(74) *Attorney, Agent, or Firm* — McDermott Will & Emergy LLP

(57) ABSTRACT

A method for hard mask layer removal includes dispensing a chemical on a hard mask layer, in which the chemical includes an acidic chemical. The chemical is drained from a chamber after hard mask removal. Using chemical including acidic chemical for hard mask layer removal is cheaper and the resource can be easily generated by equipment. Thus the chemical for hard mask layer removal can be drained directly and need not be recycled.

20 Claims, 6 Drawing Sheets

(56) References Cited

OTHER PUBLICATIONS

Emanuel Cooper et al.; Selective High-throughput TiN Etching Methods; Solid State Phenomena vol. 195 (2013) pp. 143-145, online available since Dec. 27, 2012.
Non-Final Office Action dated Apr. 30, 2015, issued in corresponding U.S. Appl. No. 14/202,876.
Final Office Action dated Sep. 4, 2015, issued in corresponding U.S. Appl. No. 14/202,876.
Notice of Allowance dated Nov. 13, 2015, issued in corresponding U.S. Appl. No. 14/202,876.

* cited by examiner

HARD MASK REMOVAL SCHEME

RELATED APPLICATIONS

The present application is a Divisional Application of U.S. application Ser. No. 14/202,876, filed Mar. 10, 2014, which are herein incorporated by reference.

BACKGROUND

Description of Related Art

Since the development of the integrated circuit (IC), the semiconductor industry has experienced rapid growth due to continuous improvements in the integration density of various electronic components (e.g., transistors, diodes, resistors, capacitors, etc.).

Semiconductor industry is continually progressing to smaller feature sizes, for example down to feature sizes of 65 nanometers, 45 nanometers, and below. A patterned photoresist layer used to produce such small feature sizes typically has a high aspect ratio. Maintaining a desired critical dimension (CD) can be very difficult for various reasons, especially for a photoresist layer with a high aspect ratio.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
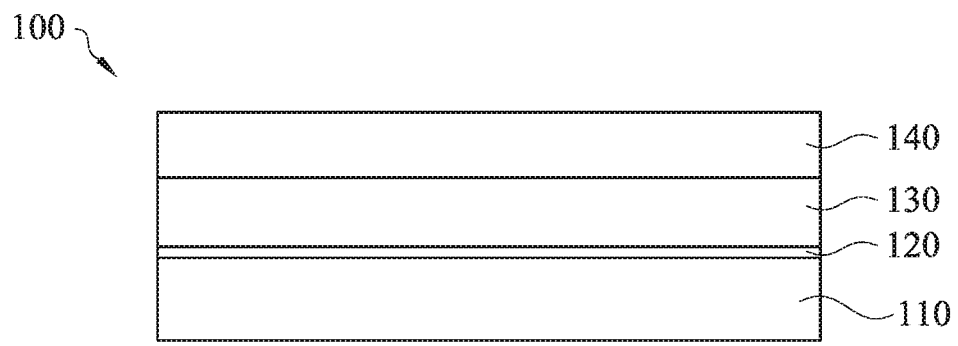
FIG. 1A to FIG. 1E show different states of a method for fabricating a semiconductor device, in accordance with some embodiments of the present disclosure.

The following disclosure provides many different embodiments, or examples, for implementing different features of the present disclosure. Specific examples of components and arrangements are described below to simplify the provided subject matter. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A to FIG. 1E show different states of a method for fabricating a semiconductor device, in accordance with some embodiments of the present disclosure. Referring to FIG. 1A, the method begins at providing a wafer 100. The wafer 100 includes a substrate 110, an etch stop layer 120 formed on the substrate 110, an underlayer 130 formed on the etch stop layer 120, and a hard mask layer 140 formed on the underlayer 130.

The wafer 100 may have a diameter of approximately 200 mm, approximately 300 mm, approximately 450 mm, or other suitable diameter.

The substrate 110 may be a semiconductor substrate made of silicon or other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The substrate 110 may include various doped regions, dielectric features, or multilevel interconnects.

The etch stop layer 120 may have a dielectric constant greater than about 3.5, and may comprise materials such as silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), silicon oxide ($SiO_2$). The thickness of the etch stop layer 120 may be between about 0.5 nm and about 100 nm. One skilled in the art will realize, however, that the dimensions recited throughout the description are merely examples, and will change if different formation technologies are used.

The underlayer 130 may be dielectric layer. The underlayer 130 can be silicon oxide ($SiO_2$), oxygen tetraethyl silane oxide (TEOS oxide), silicon carbide (SiC), silicon nitride (SiN), silicon oxynitride (SiON), or a CVD deposited Polymer. In one or more embodiments, the underlayer 130 can be made of material having low dielectric constant, such as fluorinated silicate glass (FSG), carbon doped silicon oxide such as Black Diamond (blackdiamond), very low dielectric constant less than 2.5 k materials (extremelow-k, hereinafter referred to as ELK).

The hard mask layer 140 can be a metal layer, a metal oxide layer, or a metal nitride layer. The hard mask layer 140 can be a titanium nitride layer, a tantalum nitride layer, a titanium layer, or the combinations thereof. High selectivity is provided between the hard mask layer 140 and the underlayer 130, thereby facilitating control of the critical dimension while also protecting the underlying layer 130, reducing the risk of damage to the underlying layer 130 and preserving k-value integrity. The hard mask layer 140 may be formed on the underlayer 130 in any suitable manner, such as by chemical vapor deposition (CVD), physical vapor deposition (PVD), or the like.

Figure 1B:
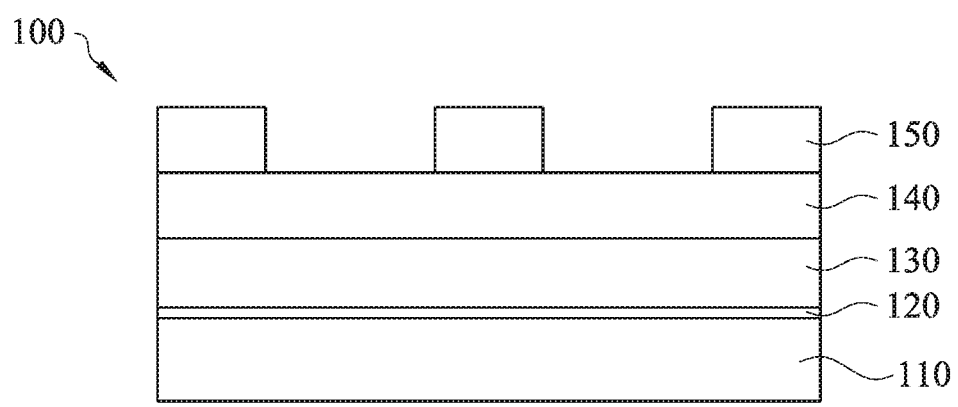

Referring to FIG. 1B, a mask layer 150 is formed on the hard mask layer 140. The mask layer 150 is a photoresist layer. The mask layer 150 is patterned by a lithography process and forms a plurality of features and a plurality of openings defined by the photoresist features on the hard mask layer 140. The pattern of the mask layer 150 is formed according to a predetermined integrated circuit pattern. The lithography process used to form the photoresist pattern may include photoresist coating, exposing, post-exposure baking, and developing. The lithography process may additionally include soft baking, mask aligning, and/or hard baking. The radiation beam used to expose the first and the second photoresist layers may be ultraviolet (UV) or EUV, such as a 248 nm beam from a Krypton Fluoride (KrF) excimer laser, or a 193 nm beam from an Argon Fluoride (ArF) excimer laser. The lithography process may utilize other exposing modes or technologies, such as on-axis, off-axis, quadripole, or dipole exposure technologies. The optical exposing process may alternatively be implemented or replaced by other proper methods such as maskless lithography, electron-beam writing, ion-beam writing, and molecular imprint techniques.

In some embodiments, an anti-reflective layer may be optionally disposed between the hard mask layer 140 and the mask layer 150 for reducing reflection during the lithography exposing process.

Figure 1C:
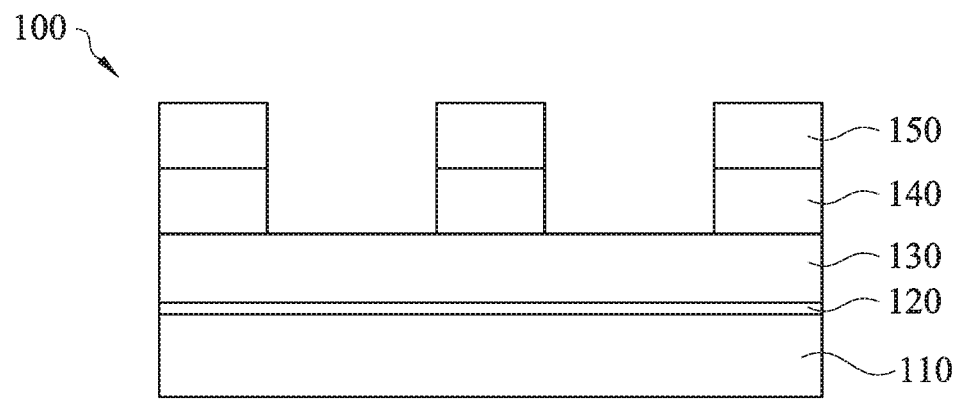

Referring to FIG. 1C, the hard mask layer 140 is patterned and partially covers the underlayer 130 as an etch mask. The pattern of the mask layer 150 is transferred to the hard mask layer 140. The hard mask layer 140 can be patterned by a dry etching process. In some embodiments, a chlorine containing gas is introduced into a process chamber via a gas source coupled to a gas inlet of the process chamber. In some embodiments, the chlorine containing gas is provided to the process chamber at a flow rate of between about 25 to about 150 sccm. Inert gases, such as argon, may be used to dilute the flow of the chlorine-containing gas. The argon to chlorine-containing gas flow rate ratio may be about 2:1 and higher. A process chamber pressure of between about 20 mTorr to about 400 mTorr may be maintained while igniting the process gas to promote plasma ignition and stability. The wafer 100 may be maintained at a temperature of between about 25 to about 50 degrees Celsius while plasma etching the titanium nitride. The mask layer 150 is further removed after this act.

Figure 1D:
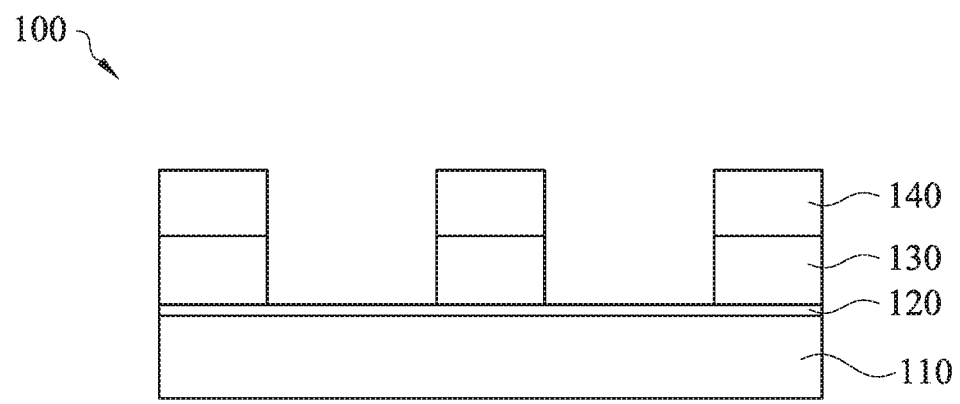

Referring to FIG. 1D, the hard mask layer 140 is utilized as an etch mask while etching the underlayer 130. The uncovered portions of the underlayer 130 are removed thereby forming a via or a trench therein. In some embodiments, the uncovered portions of the underlayer 130 are removed by a wet etching process. In some embodiments, the uncovered portions of the underlayer 130 are removed by a dry etching process.

Figure 1E:
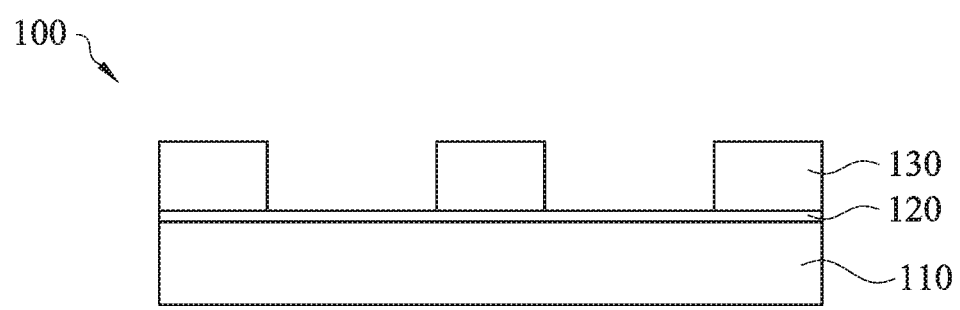

Referring to FIG. 1E, the hard mask layer 140 as the etch mask is removed from the underlayer 130 after the via or the trench is formed.

Figure 2:
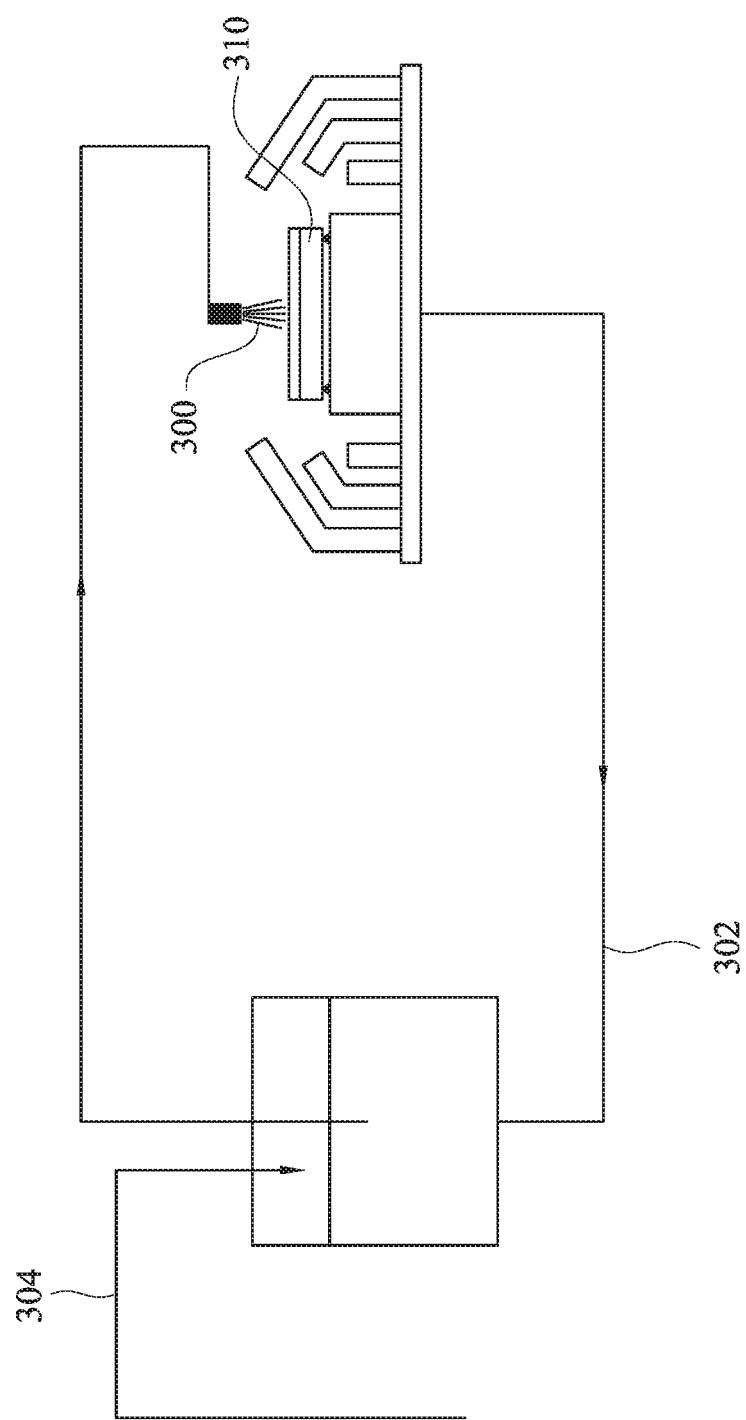
FIG. 2 is a schematic view of a conventional chamber for hard mask layer removal.

FIG. 2 is a schematic view of a conventional chamber for hard mask layer removal. For instance, the hard mask layer is a titanium nitride layer. A commercial chemical 300 including hydrogen peroxide ($H_2O_2$), which is reactive with titanium nitride, is dispensed on the surface of the wafer 310.

The reaction between the commercial chemical 300 and the titanium nitride is shown as following:

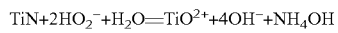

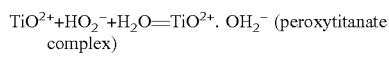

The commercial chemical 300 is reacted with the titanium nitride layer for titanium nitride removal. However, the cost of the commercial chemical is expensive, so that there is a need to recycle the reacted commercial chemical. The recycled commercial chemical 302 is mixed with fresh commercial chemical 304, and the mixture thereof is further dispensed on the surface of the wafer 310 for being reacted with the titanium nitride.

Figure 3:
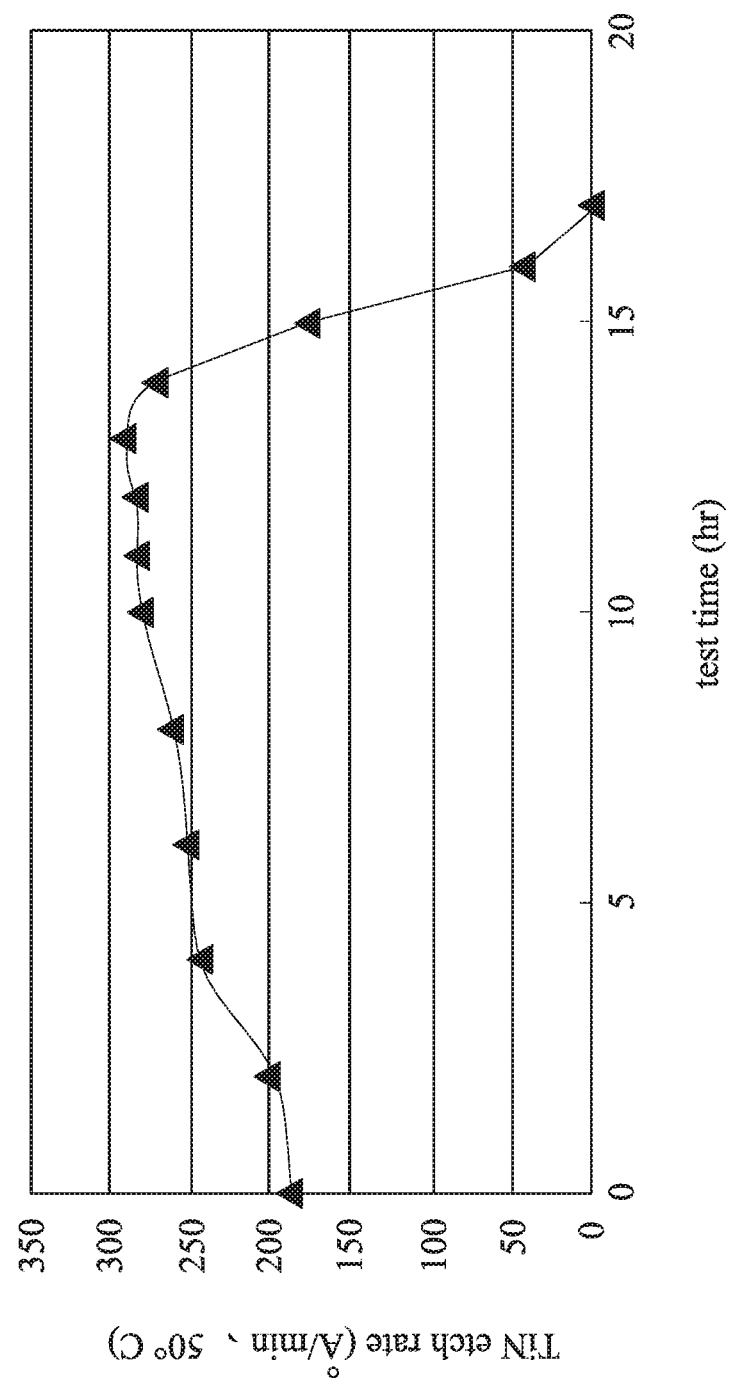
FIG. 3 shows an etch rate of the hard mask layer by using a commercial chemical.

However, the component of the commercial chemical is changed while the recycled commercial chemical including more and more peroxytitanate complex. The etch rate of the titanium nitride (hard mask layer) becomes unstable due to the increasing components in the recycled commercial chemical 302, as shown in FIG. 3. The etch rate of titanium nitride is dropped after running about 14 hours. Such unstable etch rate may occur buckling trenches or lines.

Therefore, the present disclosure provides a scheme for hard mask layer removal.

Figure 4:
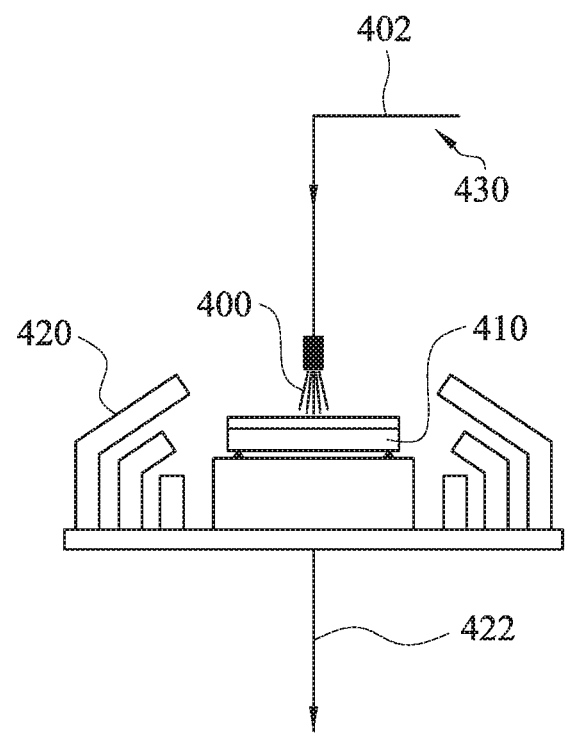
FIG. 4 is a schematic view of a chamber for hard mask layer removal, in accordance with some embodiments of the present disclosure.

FIG. 4 is a schematic view of a chamber for hard mask layer removal, according to one or various embodiments of the present disclosure. A chemical 400 is provided to the chamber 420 through at least one pipe 430 and is dispensed on a wafer 410 for removing the hard mask layer thereon. The hard mask layer can be metal, metal oxide, or metal nitride layer. For instance, the hard mask layer can be a titanium nitride layer, a tantalum nitride layer, a titanium layer, or the combinations thereof. It should be understood that the materials of the hard mask layer mentioned above are illustrative only and should not limit the scope of the present disclosure. The chemical 400 for dissolving the hard mask layer includes acidic chemical 402. The wafer 410 can be rotated in the chamber 420 for increasing reaction area between the hard mask layer and the chemical 400. The chamber 420 has an outlet 422, and the outlet 420 is not conducted to the pipe 422, such that the chemical 400 is drained from the chamber 420 after hard mask removal.

For instance, the hard mask layer is a titanium nitride layer. The reactions between the acidic chemical 402 and the titanium nitride is shown as following:

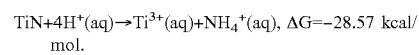

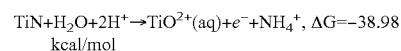

The hard mask layer, which is made of metal, metal oxide, or metal nitride, can be dissolved by acid (pH<7). ΔG of the reactions are less than zero, such that the reactions are spontaneous. The acidic chemical 402 can include organic acid, such as benzenedicarboxylic acid, naphthalenedicarboxylic acid, benzenetricarboxylic acid, naphthalenetricarboxylic acid, pyridinedicarboxylic acid, bipyridyldicarboxylic acid, formic acid, oxalic acid, malonic acid, succinic acid, glutaric acid, hexanedioic acid, heptanedioic acid and cyclohexyldicarboxylic acid, etc. The acidic chemical 402 can include inorganic acid, such as HF, HCl, HBr, HI, $HNO_3$, $H_3PO_4$, $H_2SO_4$, $HClO_4$, or a mixture thereof. The acidic chemical 402 can be solution-based or solvent-based. The acidic chemical 402 can be other possible acidic chemical using in back-end-of-line (BEOL) process, such as $CO_2$-DIW. The acidic chemical 402 may be solution with pH less than 3.

Figure 5:
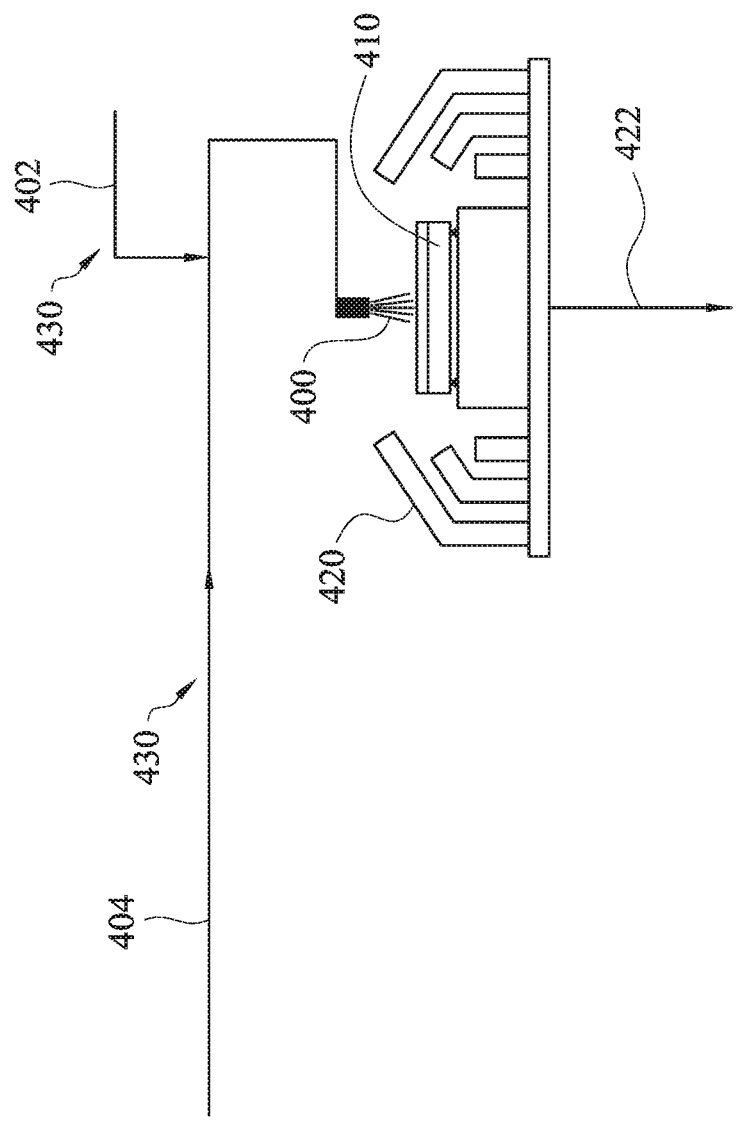
FIG. 5 is a schematic view of a chamber for hard mask layer removal, according to one or various embodiments of the present disclosure.

FIG. 5 is a schematic view of a chamber for hard mask layer removal, according to one or various embodiments of the present disclosure. In one or more embodiments, the chemical 400 further optionally includes an oxidant 404 mixed with the acidic chemical 402. The oxidant 404 can be $O_3$-DIW or $H_2O_2$. It should be understood that the acidic chemical 402 and oxidant 404 mentioned above are illustrative only and should not limit the scope of the present disclosure. A person having ordinary skill in the art may choose the acidic chemical 402 and oxidant 404 mentioned above according to actual requirements.

The oxidant 404 can further enhance efficiency of removing hard mask layer. The reaction between the oxidant 404 and the titanium nitride, for instance, can be formulated as:

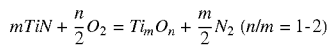

$$mTiN + \frac{n}{2}O_2 = Ti_mO_n + \frac{m}{2}N_2 \ (n/m = 1\text{-}2)$$

In one embodiment, the oxidant 404 can be mixed with the acidic chemical 402 in the piping line directly. In other embodiment, the oxidant 404 and the acidic chemical 402 can be dispensed separately. The chamber 420 has an outlet 422, such that the chemical 400 is drained from the chamber 420 after hard mask removal, and the chemical 400 drained from the chamber 420 is not recycled for hard mask removal.

Comparing with using the commercial chemical, using acid as the chemical for hard mask layer removal is cheaper and the resource can be easily generated by equipment. Thus the chemical 400 for hard mask layer removal can be drained directly and need not be recycled.

Therefore, influence came from increasing component in recycled chemical, such as buckling lines can be prevented. Furthermore, the problem of line distortion and extra thermal alloy after trench etching can be also prevented, especially in large size, ex. 450 mm, wafer.

It should be understood that the materials and the forming processes mentioned above are illustrative only and should not limit the scope of the claimed present disclosure. A person having ordinary skill in the art may choose the materials and the forming processes of each layer mentioned above according to actual requirements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, the method comprising:
   forming a hard mask layer on a dielectric layer;
   patterning the hard mask layer to expose a portion of the dielectric layer;
   removing the portion of the dielectric layer exposed by the hard mask layer;
   dispensing an acidic chemical on the patterned hard mask layer for removing the patterned hard mask layer; and
   draining the acidic chemical from a chamber, wherein the acidic chemical drained from the chamber is not recycled for hard mask removal.

2. The method of claim 1, wherein the hard mask layer is one of a metal layer, a metal oxide layer, or a metal nitride layer.

3. The method of claim 1, wherein the acidic chemical has a pH less than 3.

4. The method of claim 1, wherein the hard mask layer is patterned by performing a dry etching process.

5. The method of claim 1, wherein the removing the patterned hard mask layer by the acidic chemical is spontaneous.

6. The method of claim 1, wherein the acidic chemical is an organic acid.

7. The method of claim 1, wherein the acidic chemical is an inorganic acid.

8. The method of claim 1, wherein the acidic chemical is solution-based.

9. The method of claim 1, wherein the acidic chemical is solvent-based.

10. The method of claim 1, further comprising:
    mixing an oxidant with the acidic chemical before dispensing the acidic chemical on the patterned hard mask.

11. The method of claim 1, further comprising dispensing an oxidant on the hard mask layer.

12. The method of claim 11, further comprising draining the oxidant from the chamber, wherein the oxidant drained from the chamber is not recycled for hard mask removal.

13. A method for removing a hard mask layer, comprising:
    patterning the hard mask layer;
    dispensing an acidic chemical and an oxidant on the patterned hard mask layer to remove the patterned hard mask layer; and
    draining the acidic chemical and the oxidant from a chamber where the dispensing is performed, wherein the acidic chemical drained from the chamber is not recycled for hard mask removal.

14. The method of claim 13, wherein the acidic chemical has a PH value less than 3.

15. The method of claim 13, wherein the hard mask layer is a metal layer, a metal oxide layer, a metal nitride layer, or combinations thereof.

16. A method for removing a metal nitride layer, comprising:
    mixing an oxidant and an acid solution;
    dispensing a mixture of the oxidant and the acid solution on the metal nitride layer to remove the metal nitride layer; and
    draining the mixture of the oxidant and the acid solution from a chamber where the dispensing is performed, wherein the acidic solution drained from the chamber is not recycled for metal nitride removal.

17. The method of claim 16, further comprising:
    forming the metal nitride layer on a dielectric layer; and
    patterning the metal nitride layer.

18. The method of claim 17, wherein the mixture of the oxidant and the acid solution is dispensed on the patterned metal nitride layer.

19. The method of claim 16, further comprising draining the oxidant from the chamber, wherein the oxidant drained from the chamber is not recycled for metal nitride removal.

20. The method of claim 16, wherein the metal nitride layer is spontaneously removed by the mixture of the oxidant and the acid solution.

* * * * *